US006417602B1

(12) United States Patent
Agam et al.

(10) Patent No.: US 6,417,602 B1
(45) Date of Patent: Jul. 9, 2002

(54) ULTRASONIC TRANSDUCER

(75) Inventors: Uri Agam, Petach Tikva; Eli Gal, Ramat Gan; Ronen Jashek, Yashresh Village; Eli Ben-Bassat, Holon, all of (IL)

(73) Assignee: Sensotech Ltd., Petach Tikva (IL)

( * ) Notice: Subject to any disclaimer, the term of this patent is extended or adjusted under 35 U.S.C. 154(b) by 0 days.

(21) Appl. No.: 09/623,323

(22) PCT Filed: Mar. 1, 1999

(86) PCT No.: PCT/IL99/00117

§ 371 (c)(1),
(2), (4) Date: Nov. 13, 2000

(87) PCT Pub. No.: WO99/44757

PCT Pub. Date: Sep. 10, 1999

(30) Foreign Application Priority Data

Mar. 3, 1998 (IL) ................................................ 123533
Sep. 7, 1998 (IL) ................................................ 126117

(51) Int. Cl.$^{7}$ ............................ H01L 41/08; B06B 3/04
(52) U.S. Cl. ....................................................... 310/335
(58) Field of Search ................................ 310/322, 334, 310/335

(56) References Cited

U.S. PATENT DOCUMENTS 3,792,480 A 2/1974 Graham ...................... 343/781
3,964,014 A 6/1976 Tehon ........................... 340/9
4,208,661 A 6/1980 Vokurka ..................... 343/781
4,457,176 A 7/1984 Scholz ........................ 73/624
4,500,175 A * 2/1985 Schaff et al. ............... 359/305
4,528,853 A 7/1985 Lerch et al. .................. 73/624
4,659,956 A 4/1987 Trzaskos et al. ............ 310/335
4,779,241 A 10/1988 Atalar et al. ................ 367/104
4,791,430 A * 12/1988 Mills .......................... 310/335
4,794,930 A * 1/1989 Machida et al. .............. 601/12
4,825,116 A 4/1989 Itoh et al. .................... 310/335
4,869,278 A 9/1989 Bran .......................... 134/184
4,888,516 A 12/1989 Daeges et al. .............. 310/323
4,912,357 A 3/1990 Drews et al. ............... 310/323
4,959,674 A 9/1990 Khri-Yakub et al. ........ 346/140
5,029,480 A 7/1991 Kibblewhite ................. 73/761
5,054,470 A 10/1991 Fry et al. ...................... 128/24
5,094,108 A 3/1992 Kim et al. ..................... 73/627
5,103,129 A 4/1992 Slayton et al. .............. 310/335
5,596,989 A 1/1997 Morita .................... 128/660.1
6,007,499 A * 12/1999 Martin et al. ............... 600/459
6,030,343 A * 2/2000 Chechersky et al. ........ 351/208
6,206,843 B1 * 3/2001 Iger et al. ...................... 601/2

OTHER PUBLICATIONS

Model 250ST/R160 Air Ultrasonic Ceramic Transducer, Prowave, Taiwan.

* cited by examiner

*Primary Examiner*—Thomas M. Dougherty
(74) *Attorney, Agent, or Firm*—Ladas & Parry

(57) ABSTRACT

The invention provides for an ultrasonic transducer support with a reflector attached such that a stray energy shield is designed to at least partially envelop the transducer in order to limit the angular range of ultrasonic energy which impinges on the transducer.

18 Claims, 7 Drawing Sheets

ULTRASONIC TRANSDUCER

FIELD OF THE INVENTION

The present invention relates to ultrasonic transducers generally.

BACKGROUND OF THE INVENTION

Various types of ultrasonic or acoustic transducers are known in the art. (It is noted that the terms ultrasonic transducer and acoustic transducer shall be used interchangeably herein throughout the specification and claims.) The following U.S. Patents are believed to represent the state of the art: U.S. Pat. No. 5,103,129 to Slayton et al., U.S. Pat. No. 5,094,108 to Kim et al., U.S. Pat. No. 5,054,470 to Fry et al., U.S. Pat. No. 4,959,674 to Khri-Yakub et al., U.S. Pat. No. 4,912,357 to Drews et al., U.S. Pat. No. 4,888,516 to Daeges et al., U.S. Pat. No. 4,869,278 to Bran, U.S. Pat. No. 4,825,116 to Ito et al., U.S. Pat. No. 4,659,956 to Trzaskos et al., U.S. Pat. No. 4,528,853 to Lerch et al., and U.S. Pat. No. 4,208,661 to Vokurka.

Acoustic transducers are characterized inter alia by an angle of dispersion, and the ability to vary this angle is of major concern in transducer design. There are three major approaches in the prior art to vary the angle of dispersion:

1. Modification of transducer frequency
2. Modification of transducer size
3. Use of a horn to limit the angle of dispersion Each of these approaches has its advantages and disadvantages, and the transducer designer generally selects a solution which best fits his/her requirements,

SUMMARY OF THE INVENTION

The present invention seeks to provide an improved ultrasonic transducer which provides a compact and inexpensive solution to the problem of varying the angle of dispersion.

The present invention provides an ultrasonic transducer in off-axis relationship with a reflective surface, which surface is preferably paraboloidal. The ultrasonic transducer directs a beam onto the reflective surface, which beam is reflected therefrom to the outside world. If the beam is reflected from an object in the outside world back to the reflective surface, the reflective surface focuses the returned ultrasonic energy onto the transducer, thereby causing the transducer to provide a signal output in accordance with the reflected energy. A stray energy shield is mounted on the ultrasonic transducer for limiting the angular range of ultrasonic energy which impinges on the transducer.

It is noted that U.S. Pat. No. 3,792,480 to Graham and U.S. Pat. No. 4,791,430 to Mills both describe ultrasonic antennas with the source of ultrasonic energy off-axis to the reflective surface. However, both of these references are not concerned with transducers and indeed the structures shown in both of these references are not readily applicable for reflecting ultrasonic energy from the reflective surface back to a transducer for providing a signal output, as is of course essential in ultrasonic transducer design. It is the present invention which provides a novel arrangement of off-axis transducer and stray energy shield in order to achieve a compact and inexpensive transducer design with remarkably accurate and reliable performance. This novel arrangement is not taught nor suggested by any of the above cited art.

There is thus provided in accordance with a preferred embodiment of the present invention an ultrasonic transmitting and receiving transducer reflector assembly including an ultrasonic transducer support and a reflector extending therefrom, the reflector defining a reflective surface having optical power, an ultrasonic transducer producing a beam which is directed onto the reflective surface and providing a signal output from ultrasonic energy reflected thereonto from the reflective surface, the transducer being mounted on a mounting surface of the support in off-axis relationship with the reflective surface, and a stray energy shield at least partially enveloping the ultrasonic transducer for limiting the angular range of ultrasonic energy which impinges on the ultrasonic transducer.

In accordance with a preferred embodiment of the present invention the ultrasonic transducer support and the reflector are integrally formed as one piece. Alternatively the ultrasonic transducer support, the reflector and the stray energy shield are together integrally formed as one piece. As another alternative, the ultrasonic transducer support, the reflector and the stray energy shield are together integrally formed as one piece with a housing of the transducer.

Further in accordance with a preferred embodiment of the present invention the ultrasonic transducer is selectably locatable within the stray energy shield.

Still further in accordance with a preferred embodiment of the present invention a distance of the ultrasonic transducer relative to the reflective surface determines a shape of a beam emanating from the transducer and reflected by the reflective surface.

In accordance with a preferred embodiment of the present invention the ultrasonic transducer is located at a focus of the reflecting surface. Alternatively the ultrasonic transducer may be located inwardly or outwardly of a focus of the reflecting surface.

Further in accordance with a preferred embodiment of the present invention the ultrasonic transducer is threadably mounted within the stray energy shield.

In accordance with a preferred embodiment of the present invention the reflecting surface is a paraboloid.

Additionally in accordance with a preferred embodiment of the present invention the ultrasonic transducer and the stray energy shield are pivotally connected to the support, such that an angle of incidence of a beam reflected from the reflecting surface with respect to the transducer is variable.

There is also provided in accordance with a preferred embodiment of the invention an integral ultrasonic transmitting and receiving transducer assembly comprising an ultrasonic transducer producing a beam and a multiple beam path horn assembly operatively associated with said ultrasonic transducer and directing said beam along at least two distinct paths.

In accordance with one embodiment of the present invention, the two distinct paths are at least partially overlapping. Alternatively, the two distinct paths are not overlapping.

BRIEF DESCRIPTION OF THE DRAWINGS

The present invention will be understood and appreciated more fully from the following detailed description, taken in conjunction with the drawings in which.

DETAILED DESCRIPTION OF A PREFERRED EMBODIMENT

Figure 1:
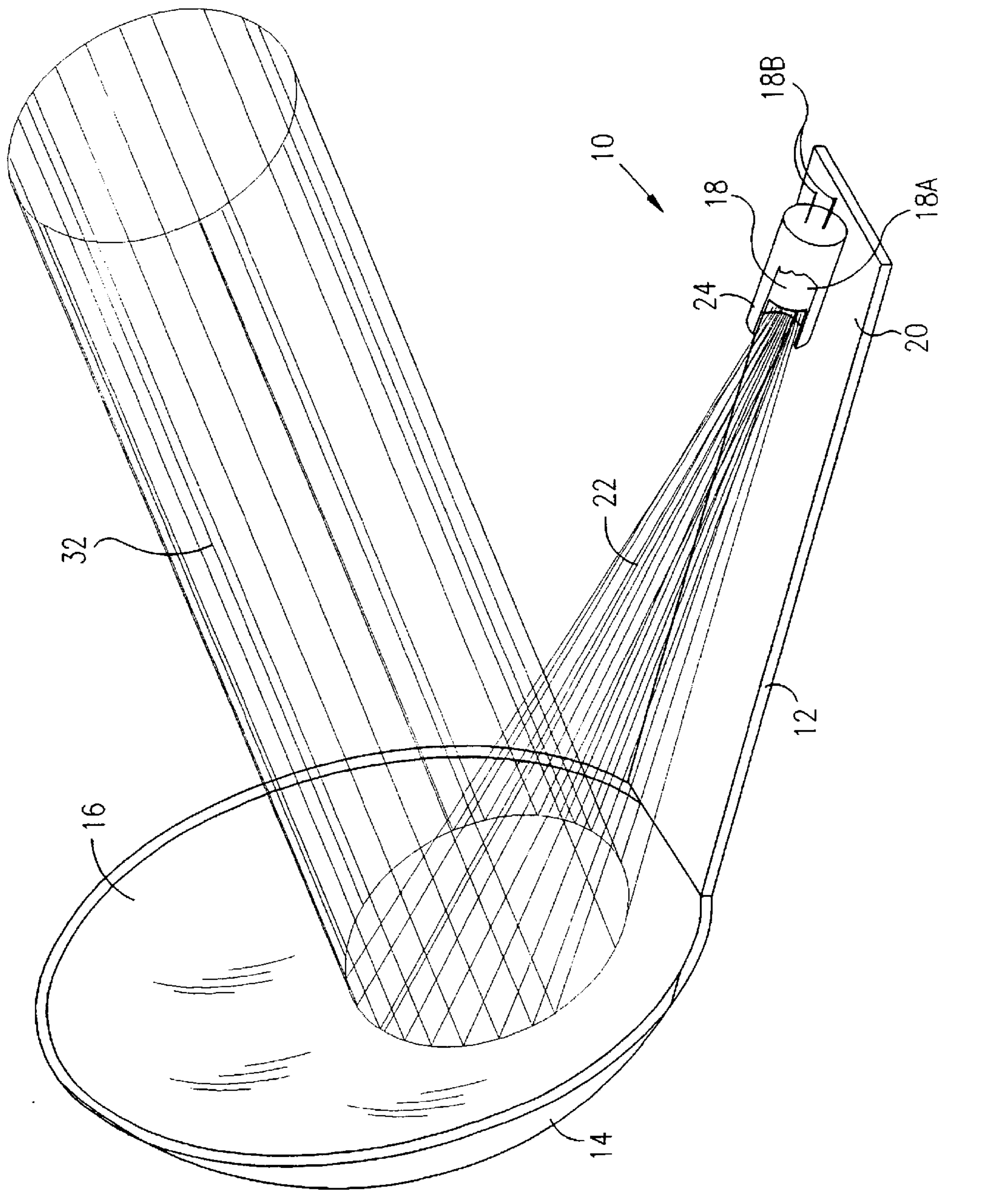
FIG. 1 is a simplified pictorial illustration of an ultrasonic transmitting and receiving transducer reflector assembly constructed and operative in accordance with a preferred embodiment of the present invention.

Reference is now made to FIG. 1 which illustrates an ultrasonic transmitting and receiving transducer reflector assembly 10 constructed and operative in accordance with a preferred embodiment of the present invention. Assembly 10 includes an ultrasonic transducer support 12 and a reflector 14 extending therefrom. Reflector 14 defines a reflective surface 16 having optical power, most preferably a paraboloidal surface.

An ultrasonic transducer 18 is mounted on a mounting surface 20 of support 12 in off-axis relationship with reflective surface 16. Transducer 18 produces a beam 22 which is directed onto reflective surface 16. Transducer 18 also provides a signal output from ultrasonic energy reflected thereonto from reflective surface 16. Transducer 18 preferably comprises a housing 18A and leads 18B. A preferred embodiment of transducer 18 is a Model 250ST/R160 manufactured by Prowave of Taiwan.

A stray energy shield 24 at least partially envelopes transducer 18 for limiting the angular range, i.e., solid angle, of ultrasonic energy which impinges on transducer 18.

In accordance with one preferred embodiment of the present invention, support 12 and reflector 16 are integrally formed as one piece, such as by molding. Alternatively, support 12, reflector 16 and stray energy shield 24 may be integrally formed together as one piece. As another alternative, support 12, reflector 16 and stray energy shield 24 may be integrally formed together as one piece with housing 18A. Of course, support 12, reflector 16 and stray energy shield 24 may all be formed separately as well.

Figure 2:
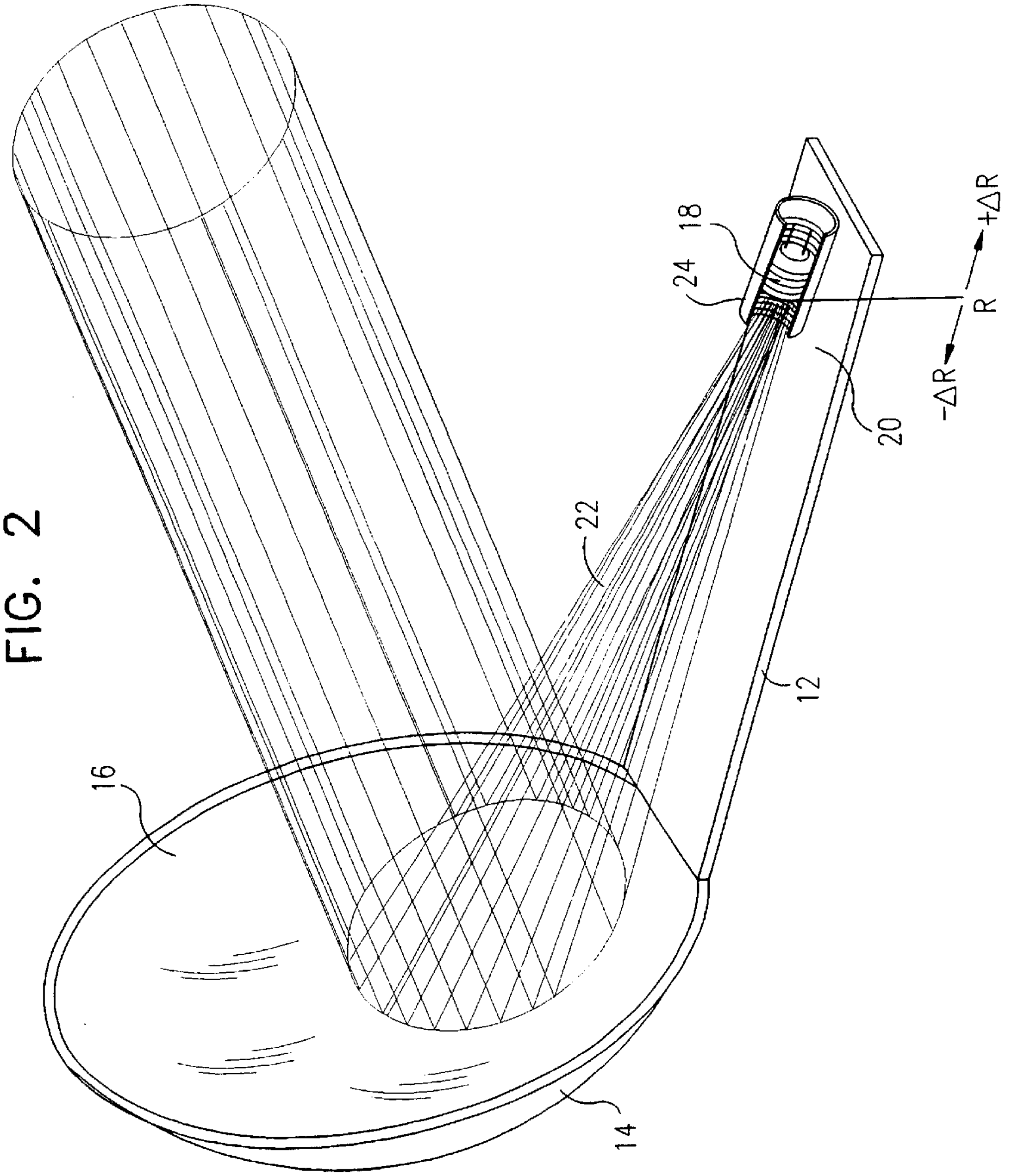
FIG. 2 is a simplified pictorial illustration of an ultrasonic transmitting and receiving transducer reflector assembly constructed and operative in accordance with another preferred embodiment of the present invention, wherein an ultrasonic transducer is selectably locatable within a stray energy shield.

Reference is now made to FIG. 2 which illustrates an ultrasonic transmitting and receiving transducer reflector assembly 30 constructed and operative in accordance with another preferred embodiment of the present invention. Assembly 30 is preferably substantially similar to assembly 10, with like elements being designated by like numerals. Assembly 30 differs from assembly 10 in that transducer 18 is selectably locatable within stray energy shield 24. Transducer 18 may be mounted for sliding motion inside shield 24 in a variety of manners. For example, transducer 18 may be threadably mounted within shield 24, and moved therein by means of a step motor (not shown). Other types of actuators may alternatively be employed to move transducer 18 within shield 24. Of course, additionally or alternatively, shield 24 may be moved by a suitable actuator.

Movement of transducer 18 with respect to reflective surface 16 determines a shape of a beam 32 emanating from transducer 18 and reflected by reflective surface 16. For example, in FIGS. 1 and 2, transducer 18 is located at a focus R of reflecting surface 16 and reflected beam 32 is generally cylindrical in shape, i.e., not converging or diverging.

Figure 3:
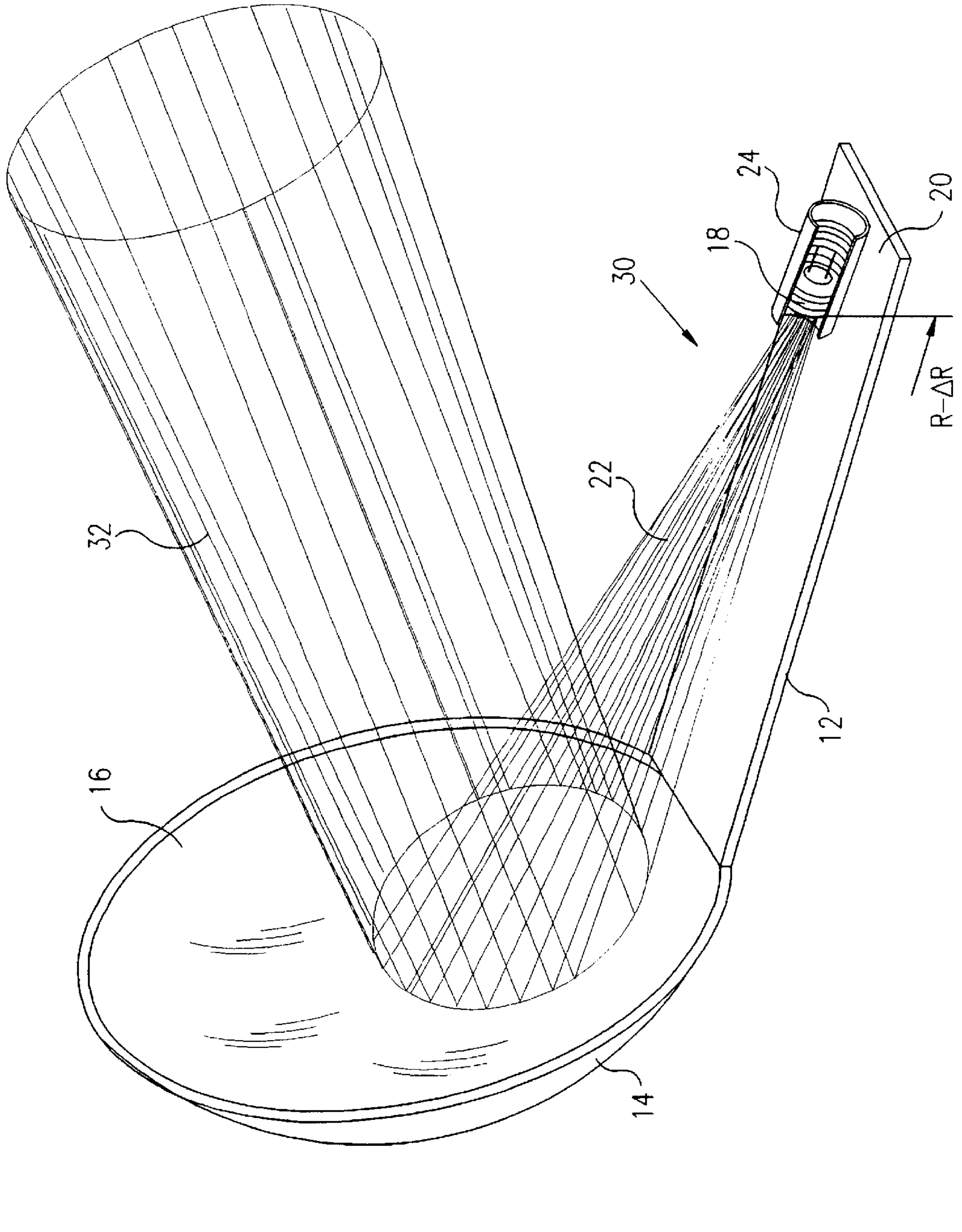
FIGS. 3 and 4 are simplified pictorial illustrations of moving the transducer closer to and further from, respectively, a reflective surface of the assembly of FIG. 2, whereby a beam reflected from the reflective surface is caused to be diverging and converging, respectively.

Reference is now made to FIG. 3 which illustrates moving transducer 18 closer to reflective surface 16 by a distance ΔR. Since transducer 18 is located inwardly of focus R, beam 32 reflected from reflective surface 16 is caused to be diverging.

Figure 4:
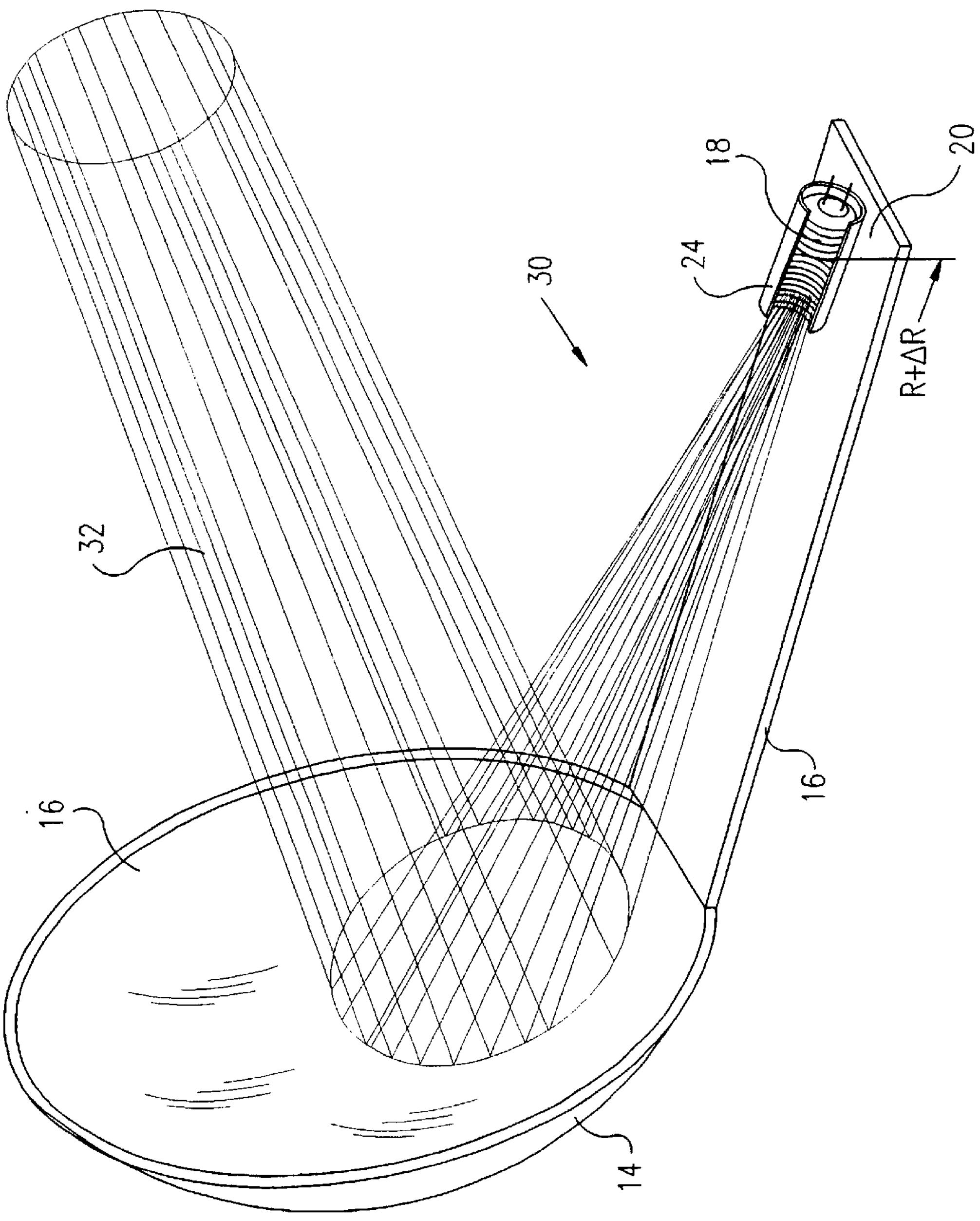

Reference is now made to FIG. 4 which illustrates moving transducer 18 further from reflective surface 16 by a distance ΔR. Since transducer 18 is located outwardly of focus R, beam 32 reflected from reflective surface 16 is caused to be converging.

Figure 5:
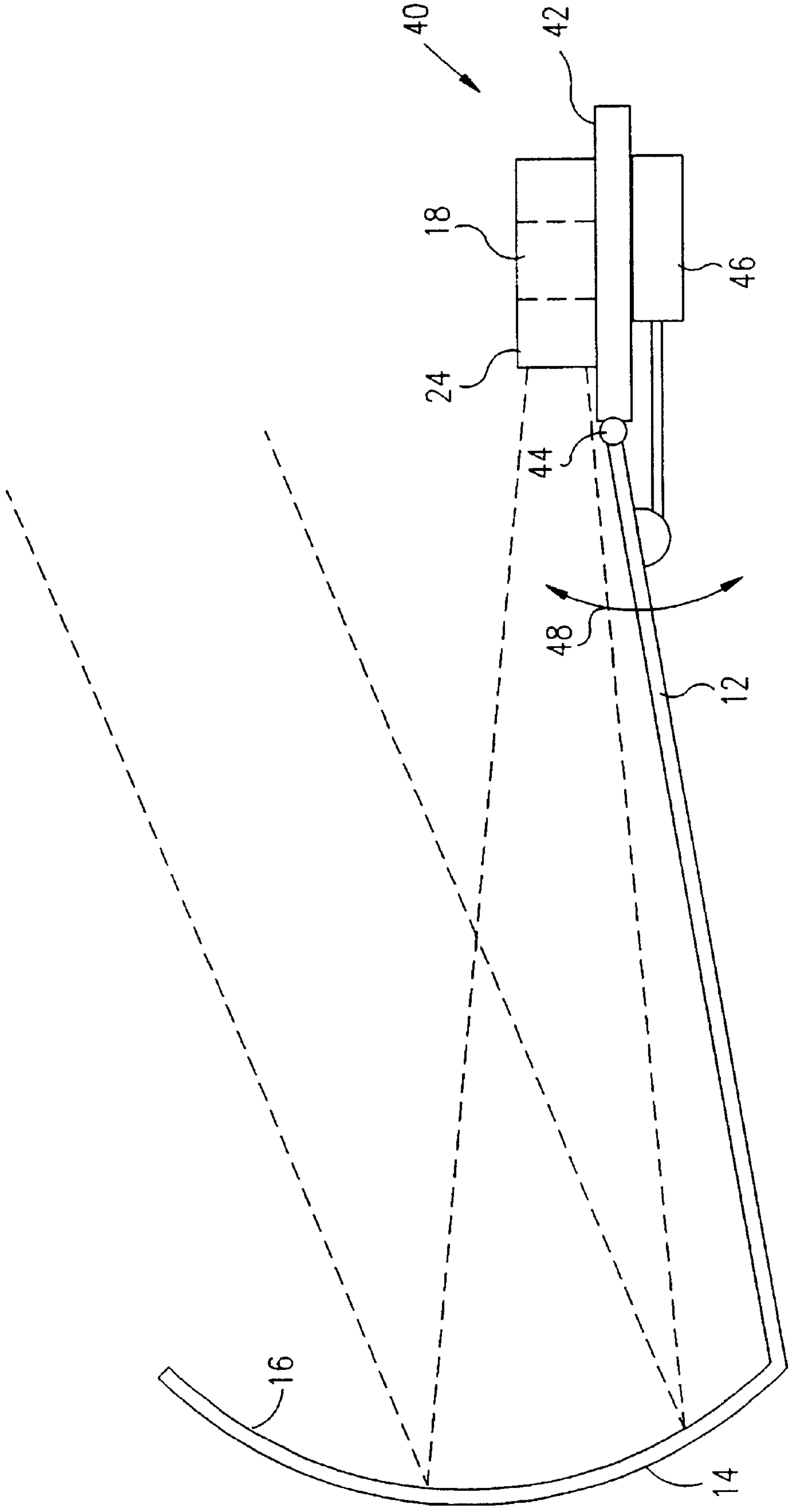
FIG. 5 is a simplified side view illustration of an ultrasonic transmitting and receiving transducer reflector assembly, wherein an angle of incidence of a beam reflected from the reflecting surface with respect to the transducer is variable, in accordance with yet another preferred embodiment of the present invention.

Reference is now made to FIG. 5 which illustrates an ultrasonic transmitting and receiving transducer reflector assembly 40 constructed and operative in accordance with yet another preferred embodiment of the present invention. Assembly 40 is preferably substantially similar to assemblies 10 or 30, with like elements being designated by like numerals. Assembly 40 differs from assemblies 10 and 30 in that transducer 18 and shield 24 are mounted on a base 42 which is pivotally connected to support 12 at a pivot 44. An actuator 46 is operative to swing support 12, together with reflector 14, about pivot 44, as indicated generally by an arrow 48. With the foregoing structure, an angle of incidence of a beam reflected from reflecting surface 16 with respect to transducer 18 is variable. In such a structure, reflective surface 16 of reflector 14 is cylindrical, for example.

Figure 6:
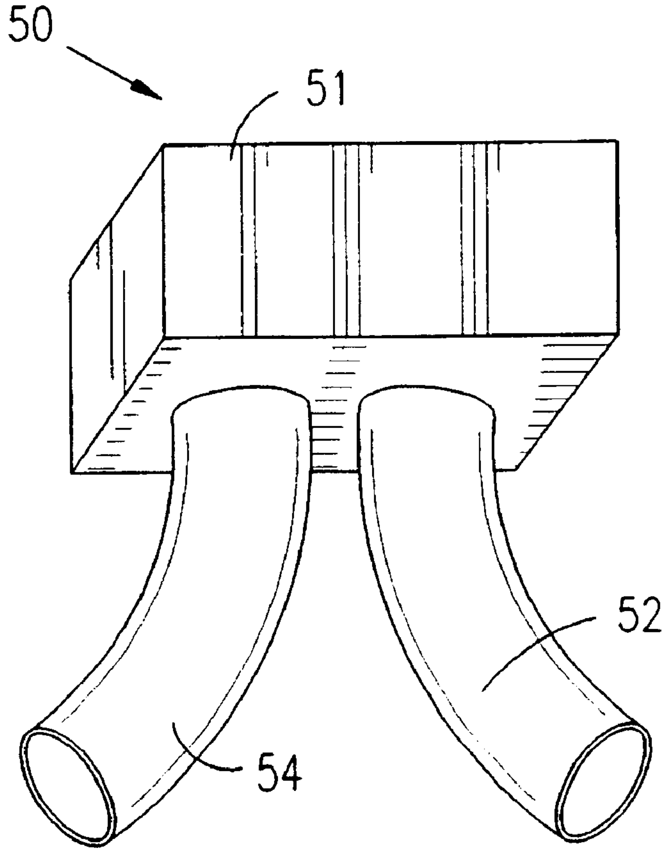
FIG. 6 is a simplified pictorial illustration of an ultrasonic transmitting and receiving transducer reflector assembly constructed and operative in accordance with another preferred embodiment of the present invention.

Reference is now made to FIG. 6, which is a simplified pictorial illustration of an ultrasonic transmitting and receiving transducer reflector assembly constructed and operative in accordance with another preferred embodiment of the present invention. The assembly comprises a housing 50 enclosing a transducer 51, such as a piezoelectric device, which communicates with at least first and second horns 52 and 54. A preferred embodiment of transducer 51 is a Model 250ST/R160 manufactured by Prowave of Taiwan. Horns 52 and 54 are preferably directed in various different directions both for transmitting and receiving ultrasonic energy.

The assembly of FIG. 6 may be used in a stand-alone manner or in combination with external reflectors, such as in the embodiments of any of FIGS. 1–5, wherein a separate reflector is employed in association with each horn.

Figure 7:
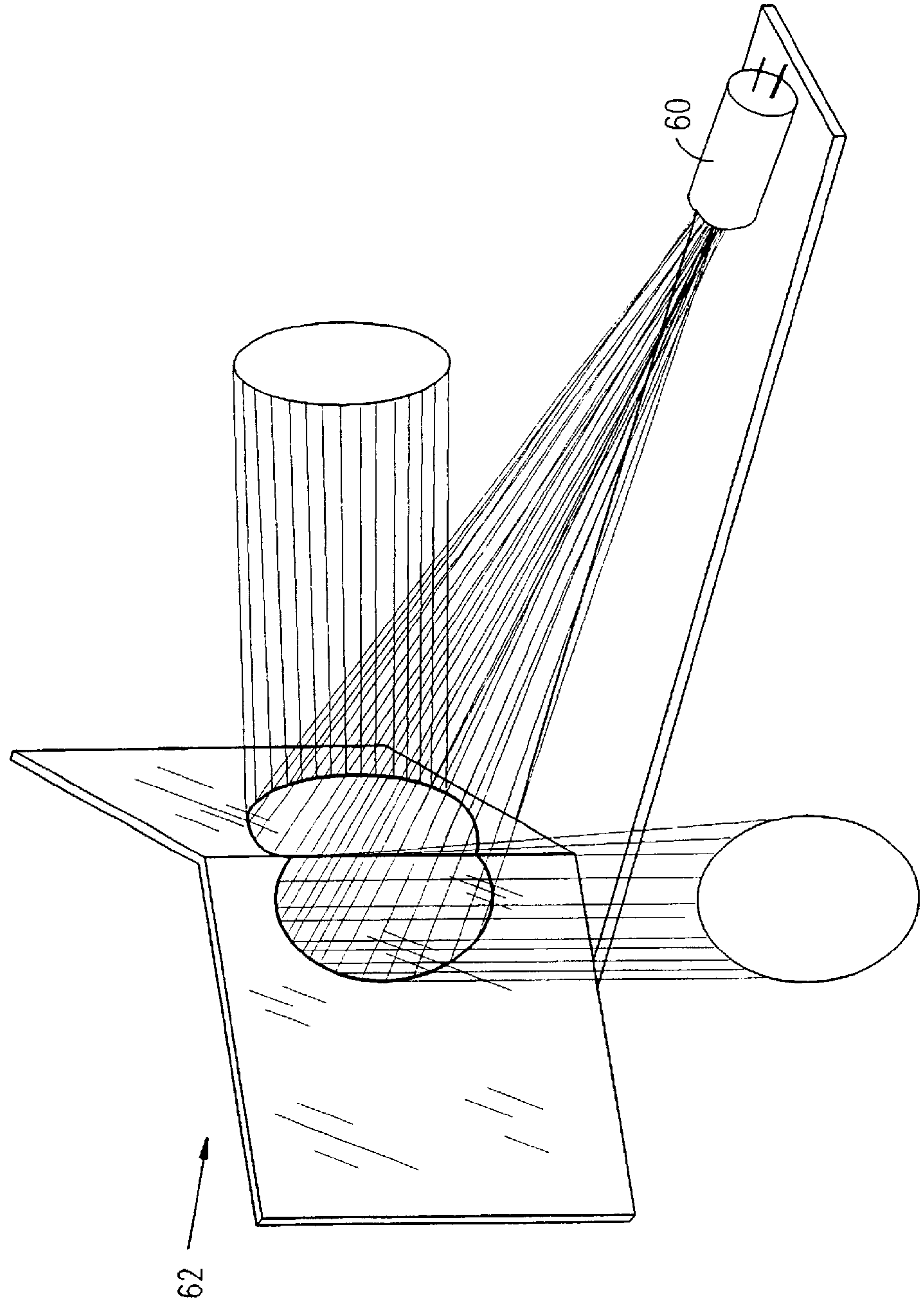
FIG. 7 is a simplified pictorial illustration of an ultrasonic transmitting and receiving transducer reflector assembly constructed and operative in accordance with yet another preferred embodiment of the present invention.

Reference is now made to FIG. 7, which is a simplified pictorial illustration of an ultrasonic transmitting and receiving transducer reflector assembly constructed and operative in accordance with a preferred embodiment of the present invention. In this embodiment a transducer 60, which may be identical to transducer 51, provides an output beam in an off-axis arrangement to at least two mirrors 62, thereby producing beams directed into at least two different directions. Although mirrors 62 are shown to be generally flat, it is appreciated that one or more mirrors 62 may be curved and/or may be associated with other optical elements having optical power. It is also appreciated that the mirrors 62 may differ from each other in their orientation, curvature or other characteristics.

It is appreciated that the embodiments of FIGS. 6 and 7 provide an integral ultrasonic transmitting and receiving transducer assembly comprising an ultrasonic transducer producing a beam and a multiple beam path horn assembly operatively associated with said ultrasonic transducer and directing said beam along at least two distinct paths.

In accordance with one embodiment of the present invention, the two distinct paths are at least partially overlapping. Alternatively, the two distinct paths are not overlapping.

It will be appreciated by persons skilled in the art that the present invention is not limited by what has been particularly shown and described hereinabove. Rather the scope of the present invention includes both combinations and subcombinations of the features described hereinabove as well as modifications and variations thereof which would occur to a person of skill in the art upon reading the foregoing description and which are not in the prior art.

What is claimed is:

1. An ultrasonic transmitting and receiving transducer reflector assembly (10) comprising:

an ultrasonic transducer support (12) and a reflector (14) extending therefrom, the reflector (14) defining a reflective surface (16) having optical power;

characterized by an ultrasonic transducer (18) producing a beam (22) which is directed onto said reflective surface (16) and providing a signal output from ultrasonic energy reflected thereonto from said reflective surface (16), said transducer (18) being mounted on a mounting surface of said support in off-axis relationship with said reflective surface (16), and a stray energy shield (24) at least partially enveloping said ultrasonic transducer (18) for limiting the angular range of ultrasonic energy which impinges on said ultrasonic transducer (18).

2. The assembly (10) according to claim 1 wherein said ultrasonic transducer support (12) and said reflector (14) are integrally formed as one piece.

3. The assembly (10) according to claim 1 wherein said ultrasonic transducer support (12), said reflector (14) and said stray energy shield (24) are together integrally formed as one piece.

4. The assembly (10) according to claim 1 wherein said ultrasonic transducer support (12), said reflector (14) and said stray energy shield (24) are together integrally formed as one piece with a housing (18A) of said transducer (18).

5. The assembly (30) according to claim 1 wherein said ultrasonic transducer (18) is selectably locatable within said stray energy shield (24).

6. The assembly (30) according to claim 5 wherein a distance of said ultrasonic transducer (18) relative to said reflective surface (16) determines a shape of a beam (22) emanating from said transducer (18) and reflected by said reflective surface (16).

7. The assembly (30) according to claim 1 wherein said ultrasonic transducer (18) is located at a focus of said reflective surface ( 16).

8. The assembly (30) according to claim 1 wherein said ultrasonic transducer (18) is located inwardly of a focus of said reflective surface (16).

9. The assembly (30) according to claim 1 wherein said ultrasonic transducer (18) is located outwardly of a focus of said reflective surface (16).

10. The assembly (30) according to claim 5 and wherein said ultrasonic transducer (18) is threadably mounted within said stray energy shield (24).

11. The assembly (10) according to claim 1 wherein said reflective surface (16) is a paraboloid.

12. The assembly (40) according to claim 1 wherein said ultrasonic transducer (18) and said stray energy shield (24) are pivotally connected to said support (12), such that an angle of incidence of a beam (22) reflected from said reflective surface (16) with respect to said transducer (18) is variable.

13. The assembly according to claim 1 wherein said stray energy shield (24) comprises a multiple beam path horn assembly (62) operatively associated with said ultrasonic transducer (18) and directing said beam (22) along at least two distinct paths.

14. The assembly of claim 13 wherein said two distinct paths are at least partially overlapping.

15. The assembly of claim 13 wherein said two distinct paths are not overlapping.

16. An integral ultrasonic transmitting and receiving transducer assembly comprising an ultrasonic transducer (18) producing a beam (22) and a multiple beam path horn assembly (62) operatively associated with said ultrasonic transducer (18) and directing said beam (22) along at least two distinct paths.

17. The assembly of claim 16 wherein said two distinct paths are at least partially overlapping.

18. The assembly of claim 17 wherein said two distinct paths are not overlapping.

* * * * *